United States Patent [19]
Duvvury et al.

[11] Patent Number: 6,040,968
[45] Date of Patent: Mar. 21, 2000

[54] EOS/ESD PROTECTION FOR HIGH DENSITY INTEGRATED CIRCUITS

[75] Inventors: Charvaka Duvvury; E. Ajith Amerasekera, both of Plano; Sridhar Ramaswamy, Dallas, all of Tex.

[73] Assignee: Texas Instruments Incorporated, Dallas, Tex.

[21] Appl. No.: 09/099,654

[22] Filed: Jun. 17, 1998

Related U.S. Application Data

[60] Provisional application No. 60/051,324, Jun. 30, 1997.

[51] Int. Cl.$^7$ .................................................. H02H 9/00
[52] U.S. Cl. ................................................................ 361/56
[58] Field of Search .............................. 361/18, 56, 111, 361/91.1, 117, 118, 119

[56] References Cited

U.S. PATENT DOCUMENTS

| | | | |
|---|---|---|---|
| 5,430,595 | 7/1995 | Wagner et al. ............................ | 361/56 |
| 5,616,943 | 4/1997 | Nguyen et al. ........................... | 257/355 |
| 5,731,941 | 3/1998 | Hargrove et al. ......................... | 361/56 |
| 5,740,000 | 4/1998 | Stackhouse et al. ...................... | 361/56 |

OTHER PUBLICATIONS

Paper: "EOS/ESD Analysis of High–Density Logic Chips," unnumbered (S. Ramaswamy, C. Duvvury, A. Amerasekera, V. Reddy and S.M. Kang), No Date.

*Primary Examiner*—Ronald W. Leja
*Attorney, Agent, or Firm*—Jacqueline J. Garner; Wade James Brady III; Frederick J. Telecky, Jr.

[57] ABSTRACT

A method for achieving improving ESD protection in integrated circuits. Capacitance associated with a power supply plays an important role in ESD protection and increasing $V_{cc\_c}$ capacitance by integrating distributed capacitors as junction capacitors, or MOS capacitors along Vcc and grounded n+ diffusion parallel runs improves protection against ESD and EOS. Additionally, at least a pair of antiparallel diodes interposed between the periphery voltage source and internal core circuitry voltage provides an added noise margin.

29 Claims, 5 Drawing Sheets

$C_1 \gg C_2$ $C_2$ LARGE $C_2 >> C_1$

EOS/ESD PROTECTION FOR HIGH DENSITY INTEGRATED CIRCUITS

This application claims priority under 35 USC § 119 (e)(1) of provisional application No. 60/051,324, filed Jun. 30, 1997.

BACKGROUND AND SUMMARY OF THE INVENTION

The present invention relates to Electrical Over-Stress ("EOS") and Electrostatic Discharge ("ESD") protection in high density integrated circuits.

Modern integrated circuits are easily damaged by excess voltages, and one common source of such potentially damaging voltages is caused when two materials are rubbed together. A person can develop very high static voltage, from a few hundred to several thousand volts, simply by walking across a room or by removing an IC from its plastic package, even when careful handling procedures are followed. The impact of ESD damage due to handling and testing can have a significant influence on product yield. Large ICs manufactured in advanced processes may only have 30 to 40 chips per six inch wafer. Any product loss due to ESD damage has a direct impact on profitability and even fall-outs of the order of 1% are not acceptable. Another issue which gives increasing importance to ESD control is the move toward replaceable ICs in electronic systems. Instead of replacing the whole circuit board, as used to be the standard practice, users are now encouraged to purchase upgrades to their microprocessors and memory cards and perform the installation themselves. Since the installation does not necessarily take place in an ESD-safe environment, the ICs need to be ESD robust.

A longstanding problem is that if such a high voltage is accidentally applied to the pins of an IC package, the discharge can cause gate oxide breakdown of the devices to which it is applied. The breakdown may cause immediate destruction of the device, or it may weaken the oxide enough such that failure may occur early in the operating life of the device and thereby cause later device failure in the field.

In MOS integrated circuits, the inputs are normally connected to drive the gate of one or more MOS transistors. (The term "MOS" is used in this application, as is now conventional, to refer to any insulated-gate-field-effect-transistor, or to integrated circuits which include such transistors.) Furthermore, all pins are provided with protective circuits to prevent voltages from damaging the MOS gates. These protective circuits, normally placed between the input and output pads on a chip and the transistor gates to which the pads are connected, are designed to begin conducting, or to undergo breakdown, thereby providing an electrical path to ground (or to the power-supply rail) when excess voltage occurs. Such protection devices are designed to avalanche (passing a large amount of current, and dissipating the energy of the incoming transient) before the voltage on the input pin can reach levels which would damage the gate oxide. Since the breakdown mechanism is designed to be nondestructive, the protective circuits provide a normally open path that closes only when the high voltage appears at the input or output terminals, harmlessly discharging the node to which it is connected.

However, technological advances are leading to the creation of smaller and faster components that are increasingly more fragile. The output stages of MOS circuits which, until now, have been capable of withstanding high discharge currents, are becoming more vulnerable. In particular, the advantages of the various techniques for improving the performance characteristics of integrated circuits are offset by increased sensitivity to over-voltages or discharges. Breakdown voltages of the junctions or punch-through voltages between drain and source of the MOS transistors are becoming lower and the gate oxide is more fragile. Such techniques as thinning of the gate oxide layers, the reduction in width of the conduction channels of the transistor or the very low doping and small thickness of the drain regions of transistors are forcing circuit designers to focus more attention to protection as transient voltages have a greater impact due to advances in IC fabrication. (Flow of large currents may lead to generation of hot carriers, which can become trapped in the gate oxide and produce a long-term shift in the characteristics of the device.)

A variety of device structures for protecting integrated circuits against electrostatic discharge have been proposed. See, e.g., Duvvury et al., "ESD: a pervasive reliability concern for IC technologies," 81 PRoc. IEEE 690 (1993); Amerasekera and Duvvury, ESD IN SILICON INTEGRATED CIRCUITS (1995); Ramaswamy et al., "EOS/ESD Reliability of Deep Sub-Micron NMOS Protection Devices", International Reliability Physics Symposium (IRPS) (1995). These publications, and the references cited therein, are incorporated by reference.

SUMMARY OF THE INVENTION

The present application discloses techniques for enhancing ESD protection in integrated circuits. By taking advantage of circuit capacitance of power supply lines and, where applicable, increasing capacitance of the core circuitry, the transient effects of voltage and current are delayed by increasing the rise time of the potentially damaging transients. This delay allows substrate inverters to turn on and route the transients to ground. To increase the capacitance associated with a supply, all available bus area on the chip is used. A method utilizes the fabrication of junction capacitors and MOS capacitors. Junction capacitors are implemented by stitching the Vcc bus line to the n+ diffusion all along the chip routing. MOS capacitors are implemented whenever ground and the Vcc bus lines run in parallel. To obtain the most benefit from the available capacitance, a pair of antiparallel diodes are preferably implemented between the outer and inner circuitry supply lines. Both the protection diode of the outer circuitry and the pair of antiparallel diodes allow the circuit designer to take advantage of the additional high capacitance of the inner circuitry. In mixed voltage circuits, where output and input circuits are supplied by different voltages, one of a pair of the antiparallel diodes are replaced with a greater number of diodes.

Advantages of the disclosed methods and structures include:

enhances ESD protection;

utilizes existing features of the circuitry;

minimal additional substrate real estate and cost.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The efficiency of an EOS/ESD protection circuit can depend upon the capacitance associated with the Vcc power supply connected to the pin. That is, if the protection scheme uses a diode connected to Vcc for the case of inputs or a p-channel pull-up in the case of outputs, the Vcc capacitance will have an impact on the protection level that can be achieved. In the case of multiple power supplies, the ESD level can vary for the different pins or the ESD level can vary from large IC chips to small IC chips. This invention describes a method to achieve maximum EOS/ESD protection in IC chips.

Figure 7:
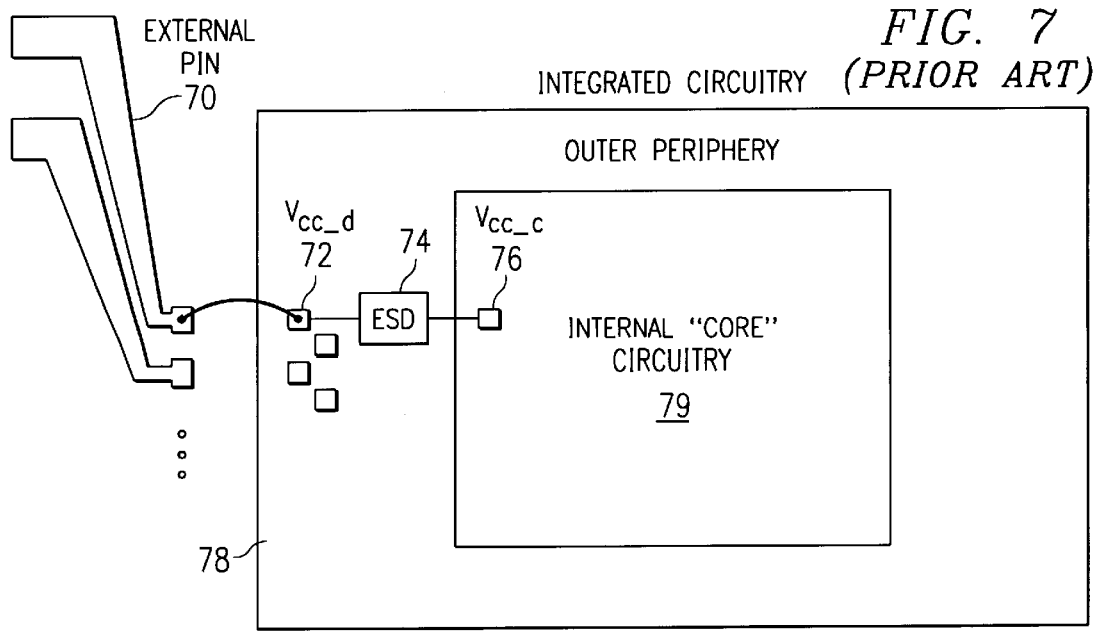
FIG. 7 shows a prior art IC with inner core and outer periphery circuitry areas.

A typical prior art integrated circuit structure with lead-bonding to an external pin is shown in FIG. 7. Power supply voltage is applied to an external pin 70 and presented to a contact pad 72. The contact pad 72 is fabricated in a region of the IC designated as the outer periphery 78. The outer periphery 78 also comprises a transient voltage protection circuit 74. Current is routed from the external voltage source over metal lines through the protection circuit 74 to the internal "core" circuitry 79. The internal voltage at Vcc_c 76 is more stable and free from voltage transients ("clean") relative to voltage Vcc_d at the contact pad 72 which is exposed to noise and voltage transients ("dirty"). The overvoltage protection circuit 74 is designed to block transient voltages from passing into the core circuitry 79 and damaging the IC.

Figure 1A:
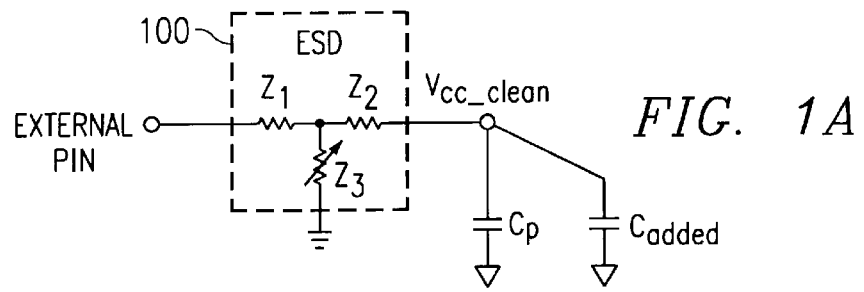
FIGS. 1A and 1B show a preferred embodiment of the ESD protection circuit.

A very generalized protection circuit 100 is shown in FIG. 1A. Power is applied to an IC chip through an external pin to a voltage-dependent shunt impedance Z3 which goes to a very low Z when voltage rises above normal (impedance Z3 may be, for example, a thyristor, or conventional protection device to ground). The ESD protection circuitry will also usually contribute to series impedances Z1 and/or Z2, but in any case these impedances will not be exactly zero, due to the parasitic resistances of the internal and external wiring.

The effectiveness of the overvoltage protection circuit 100 can be enhanced by increasing the capacitance $C_{added}$ associated with supply voltage reaching the internal circuitry, designated Vcc_clean. Supply voltage is routed through metal lines to the internal circuitry and of course some parasitic capacitance Cp will be present, but $C_{added}$ is larger. It should be noted that this method for enhancing ESD protection by increasing capacitance of the core circuitry is only necessary for integrated circuits with core circuitry areas of approximately 1 $cm^2$ or less. Core circuits larger than this tend to have sufficient capacitance such that adding capacitance is unnecessary. For those circuits for which added capacitance is useful, the amount added can be variable, e.g., adding anywhere from three to thirty times as much capacitance as is otherwise present. Methods for adding distributed capacitors will be discussed later.

Figure 4A:
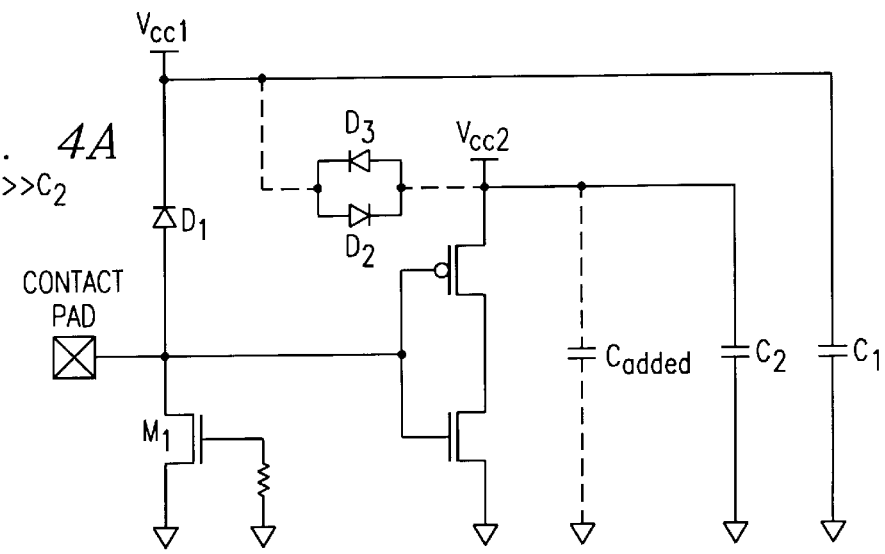
FIGS. 4A–4C show another ESD protection design for advanced CMOS inputs.
Figure 4B:
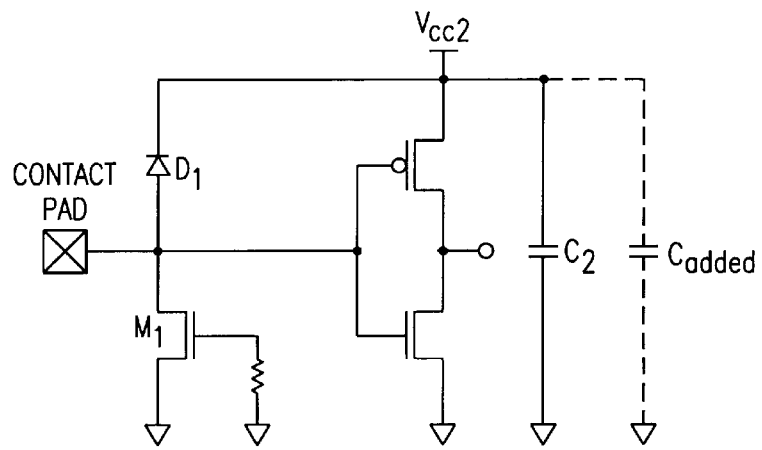
Figure 4C:
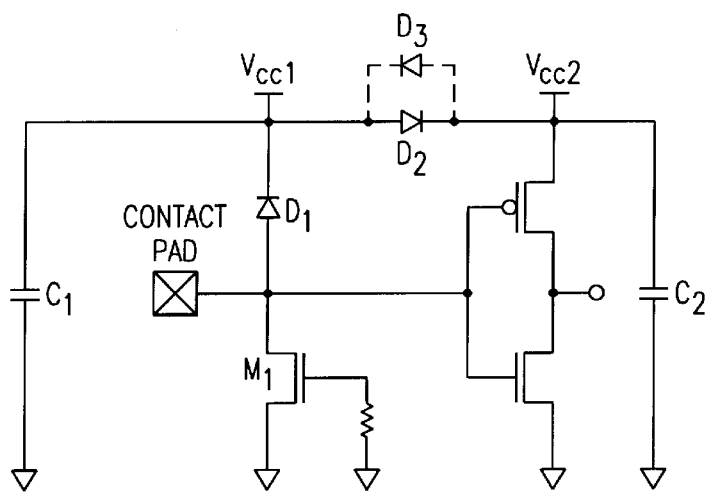

A very effective protection scheme for advanced CMOS technologies is shown in FIGS. 4A–4C. Protection diode D1 and NMOS device M1 are fabricated in close proximity to one another to obtain the maximum EOS/ESD protection capability offered by NMOS device M1. However, the capacitances associated with voltage supply Vcc1 and inner circuitry voltage node Vcc2 play an important role in device protection.

Figure 2:
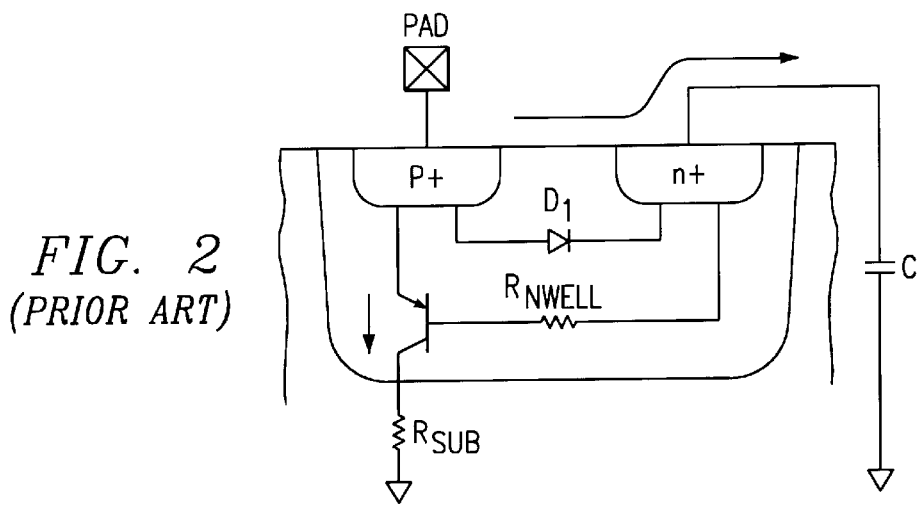
FIG. 2 shows a cross-section of a prior art integrated ESD protection structure.

If Vcc1 capacitance C1 is much larger than Vcc2 capacitance C2 (C1>>C2), as shown in FIG. 4A, then it is advantageous to connect the protection diode D1 to Vcc1. The higher capacitance of C1 will allow more charging time through protection diode D1. This in turn will allow more time for conduction of the vertical PNP transistor in D1 (FIG. 2) to charge up the substrate for efficient turn-on of M1. If C2 is large (FIG. 4B), the protection diode D1 should be connected directly to the inner voltage node Vcc2. Additionally, distributed capacitance $C_{added}$ may also be fabricated to enhance the capacitance effects for protection against EOS/ESD. If C2>>C1 (FIG. 4C), an additional diode D2 should be fabricated between the external voltage supply source Vcc1 and the inner core circuitry voltage node Vcc2. It is important to connect the protection diode D1 to the power bus with the largest capacitance.

Adding diode D3 in an antiparallel fashion with diode D2 (FIGS. 4A and 4C) offers additional protection by increasing the noise margin between the outer periphery voltage Vcc1 and the inner core circuitry voltage Vcc2.

Figure 3A:
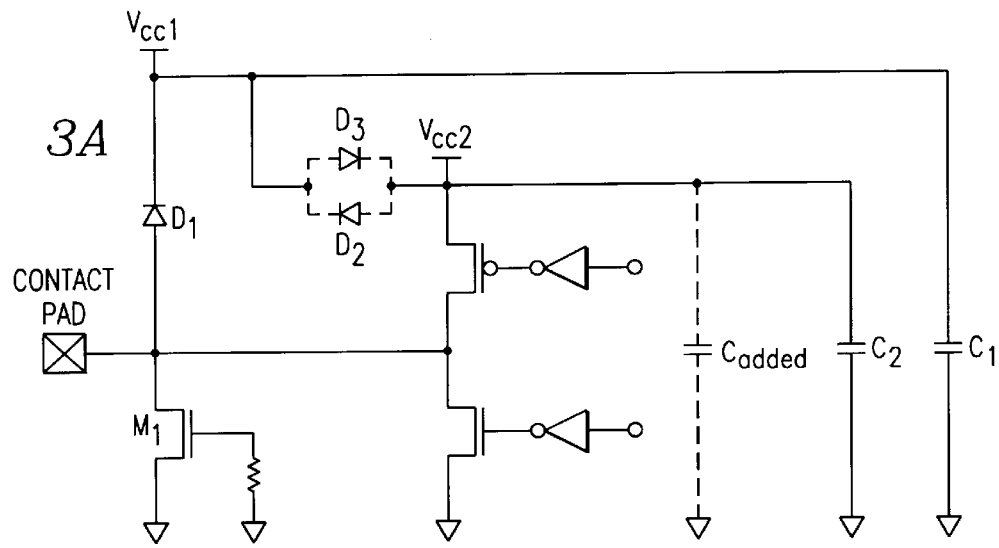
FIGS. 3A and 3B schematically show an ESD protection design for CMOS outputs.
Figure 3B:
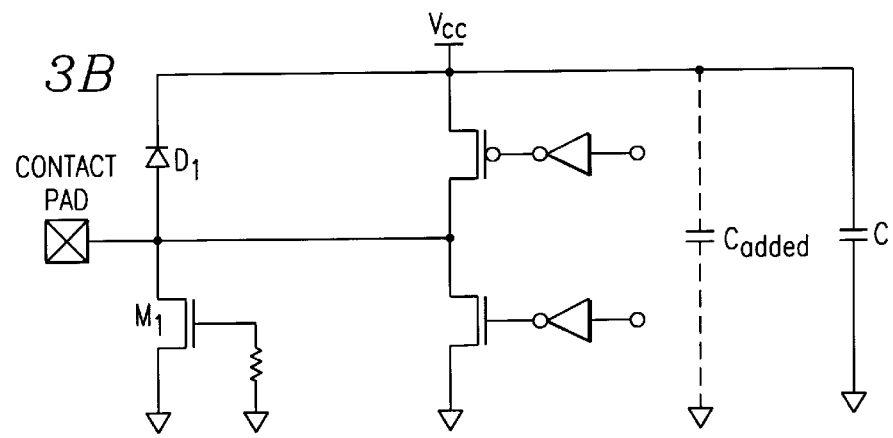

Since the protection diode, along with voltage supply capacitance, play an important role, the same approach can be used for CMOS outputs. FIG. 3A shows a twin-supply voltage source configuration. If Vcc1 capacitance C1 is much larger than Vcc2 capacitance C2, then it is advantageous to connect the protection diode D1 to Vcc1. Furthermore, the addition of a antiparallel diode pair, D2 and D3, offer additional protection by increasing the noise margin between the outer periphery voltage supply Vcc1 and the inner core circuitry voltage source Vcc2. FIG. 3B shows a single-supply utilized for the protection circuit and the outputs, and where the protection diode is connected directly to the voltage source. Again, the choice of connection for the protection diode will depend on if C1>>C2 or C2>>C1. In either scenario, capacitance $C_{added}$ can be added to the appropriate power supply lines to enhance the EOS/ESD protection.

However, the previous connections discussed in FIG. 3 and FIG. 4 are not practical.

Figure 1B:
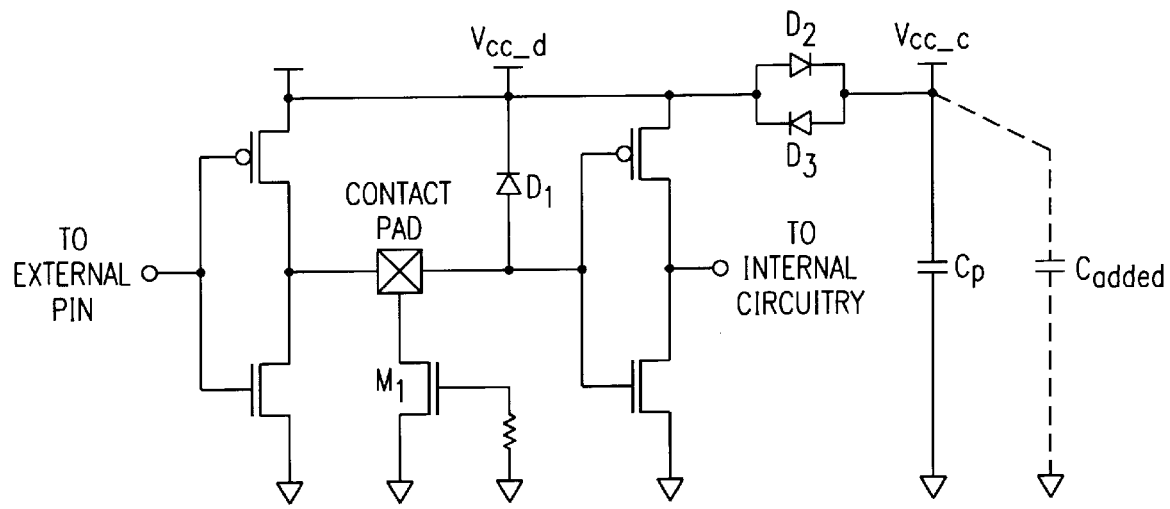

A more useful approach is shown in FIG. 1B. Vcc_d is the "dirty" voltage source to which all output drivers are connected. The Vcc_d bus is routed around the outer periphery of the integrated circuit structure. Vcc_c is the "clean" noise overvoltage-isolated loading connection node to which the internal core logic is connected. Diode D2 and diode D3 are antiparallel diodes connected between Vcc_d and Vcc_c. D2, biased in the same direction as D1, and in conjunction with D1 will allow one to take advantage of the high capacitance of Vcc_c and provide an additional noise margin between Vcc_c and Vcc_d. Diode D3 will prevent any potential buildup on Vcc_c relative to Vcc_d.

Figure 9:
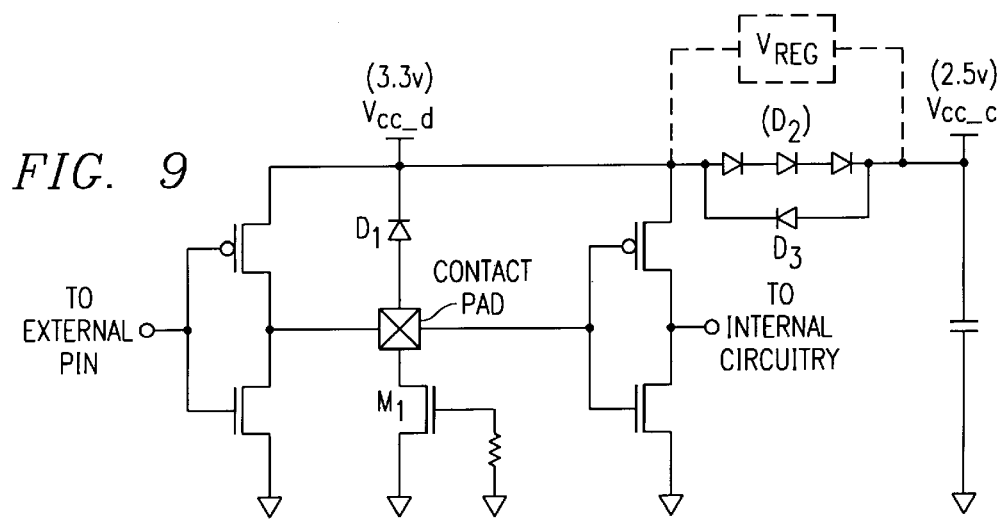
FIG. 9 shows a mixed voltage scenario with an increased diode count.

In FIG. 9, a mixed voltage scenario arises where the voltage at Vcc_d, for example 3.3 volts, will be slightly greater than the voltage supplied at node Vcc_c to the inner core circuitry, shown as 2.5 volts. To enhance the noise margin between Vcc_d and Vcc_c, additional diodes will be substituted for D2 (one diode in previous discussions, three shown in FIG. 9).

In some IC designs the Vcc_c capacitance may not be high if only a small amount of circuitry is connected to it. This is especially the case if it is a block of analog circuitry. In these cases, to increase the protection device performance, additional capacitors can be added to the Vcc_c bus.

Figure 5A:
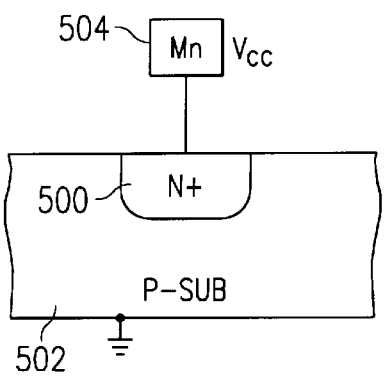
FIGS. 5A–5E show device structures for adding capacitance to integrated circuits.

In FIG. 5A, a typical junction capacitor is depicted where a highly doped n+ region 500 is diffused into a p-type substrate 502. The p-type substrate 502 is grounded. This capacitor may be fabricated several layers deep such that the application of voltage to the n+ region requires metallization Mn 504 through several layers, where n indicates the layer at which metallization contact is made.

Figure 5B:
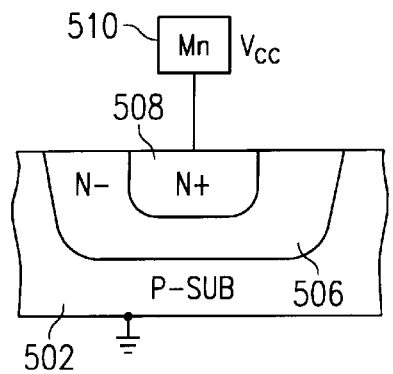

In FIG. 5B, another type of junction capacitor is shown using both an n-well region 506 and a highly-doped n+ region 508 diffused into a p-type substrate 502. Metal contact 510 to the n+ region 508 is required for the application of voltage.

Figure 5C:
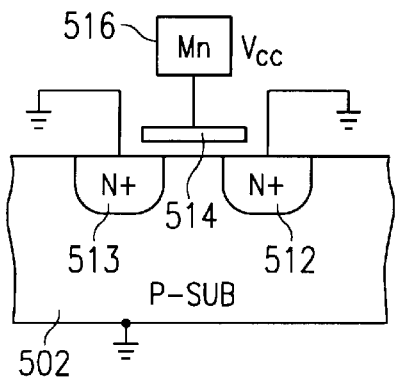

In FIG. 5C, a MOS capacitor is shown with two highly doped n+ regions (512 and 513) diffused into a p-type substrate 502. Capacitors are formed at the overlap of the metallization plate 514, in this case made of poly-1, with the n+ diffusion regions (512 and 513). The n+ doped regions (512 and 513) are coupled to a reference node (e.g., ground).

Figure 5D:
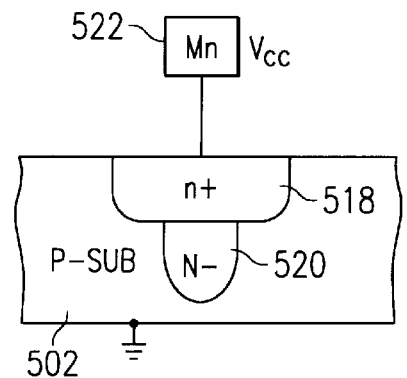

FIG. 5D shows a junction capacitor where the n-well 520 is significantly narrowed and extends below the bottom of the overlying doped n+ region 518 as opposed to surrounding the n+ region as in FIG. 5B. Again, voltage may be applied to a contact pad 522 through multiple layers of metallization to the n+ region 518.

Figure 5E:
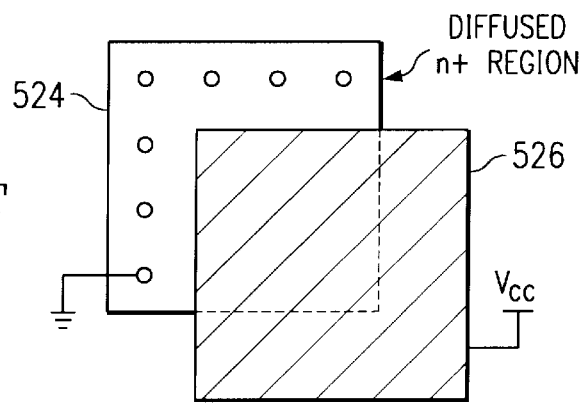

FIG. 5E shows a lumped capacitor which can be used with or instead of distributed capacitors. The n+ diffusion region 524 is grounded while the upper "plate" 526 of the capacitor is poly-1 or poly-2 and connected to the voltage source.

The junction capacitors in FIGS. 5A, SB, and 5D are implemented by fabricating the Vcc bus line to the n+ diffusion area all along the chip routing. The MOS capacitor is implemented wherever the grounded n+ diffusion areas and Vcc_c bus lines run in parallel. The lumped capacitor in FIG. 5E is implemented in addition to or in place of distributed capacitors.

Figure 6:
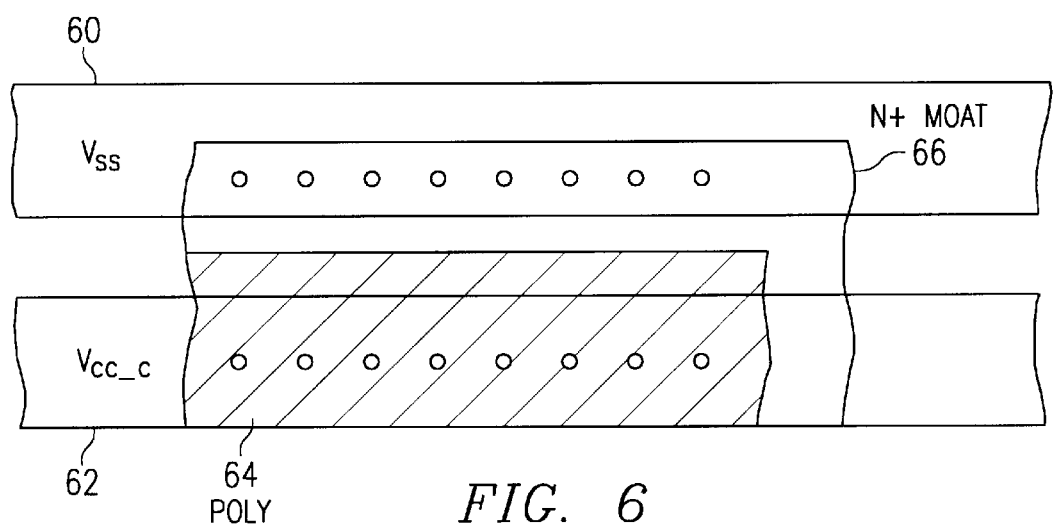
FIG. 6 shows a MOS capacitor implementation when Vcc and GND buses run in parallel.

In FIG. 6, Vcc_c 62 and Vss 60 run in parallel and accommodate the fabrication of distributed capacitors to increase the Vcc_c core capacitance. The poly layer 64 and n+ moat 66 are processed in such a way to derive the most capacitance from the parallel runs possible. The increased core capacitance, as mentioned before, enhances the effectiveness of the protection circuitry by increasing the charge time and thereby delaying transient voltages sufficiently for protection devices to turn-on and ground the damaging voltages.

Figure 8:
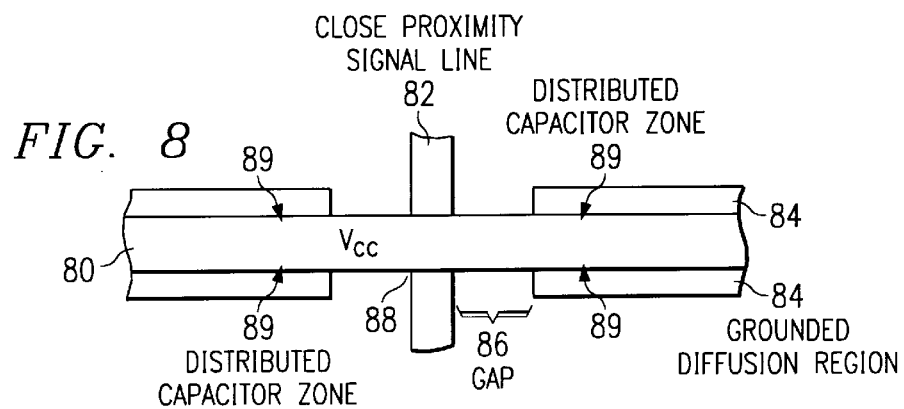
FIG. 8 shows a power supply run with distributed capacitors crossing a signal line.

All available bus area on the chip is used to maximize the Vcc_c capacitance. However, as shown in FIG. 8, where a power bus 80 crosses in close proximity to a signal line 82, the distributed capacitor 89 fabricated along the power bus and in parallel with a grounded diffusion layer 84, must be terminated near the crossover zone 88, producing a gap 86 in the horizontal and vertical planes near the crossover zone 88 sufficient to reduce or eliminate the potential for crosstalk.

The N-well may be placed in all Vcc contacts to suppress "spiking," as described in U.S. Pat. No. 5,369,041, hereby incorporated by reference.

The increased Vcc_c capacitance method will also give improvement in the longer time regime of electrical overstress ("EOS"). In this case, the voltage at the contact pad rises slowly, and meanwhile, enough current is pumped into the substrate to turn on several inverters between Vcc and Vss. This will increase the current handling capability and thus improve EOS reliability. These effects on improved reliability as a result of larger Vcc capacitance have been experimentally verified for both ESD and EOS regimes.

Alternative Embodiment: On-Chip Regulation

The scheme described in FIGS. 1A and 1B can also be useful for mixed voltage circuits where the outputs and internal circuits are connected to different Vcc voltage levels. For example, in FIG. 9, if Vcc_d is 3.3 V and Vcc_c is 2.5 V, diode D2 is replaced by a string of three diodes.

Alternative Embodiment: Trench Capacitors

If the integrated circuit is fabricated in a process which provides trench capacitors, then these structures too can be used to add distributed capacitance to the power supply lines within the core logic (to the extent that layout constraints permit).

Alternative Embodiment: Poly-to-poly Capacitors

If the integrated circuit is fabricated in a process which provides poly-to-poly capacitors, then these structures too can be used to add distributed capacitance to the power supply lines within the core logic (to the extent that layout constraints permit).

Alternative Embodiment: DRAM Capacitors

If the integrated circuit is fabricated in a process which provides DRAM capacitors with a high-k dielectric (such as barium strontium titanate or tantalum pentoxide), then these structures too can be used to add distributed capacitance to the power supply lines within the core logic (to the extent that layout constraints permit).

Alternative Embodiment: Capacitors - Narrow N-well

If the integrated circuit is fabricated in a process which provides narrow N-well capacitors then these structures can be used to add distributed capacitance to the power supply lines within the core logic (to the extent that layout constraints permit).

Alternative Embodiment: Schottky Diode

Diode protection against ESD/EOS in integrated circuits can be achieved using Schottky diodes.

Alternative Embodiment: MOS Diode

Diode protection against EOS/ESD in an integrated circuit can be accomplished with fabricated MOS diodes.

Alternative Embodiment: Avalanche Breakdown Diodes (Zener)

Diode protection against ESD can be accomplished with avalanche breakdown diodes.

Alternative Embodiment: Motor Vehicle Application

If the integrated circuit is fabricated for a specific application, e.g. automotive instrumentation, it is conceivable that three voltages (5 v, internal Vcc, and either standard 12 volt-cars or 24 volt-trucks) may be supplied to the integrated circuit and in this case, three antiparallel diode pairs are used between the three voltage sources to reduce noise and provide EOS/ESD protection.

Alternative Embodiment: Mixed Voltage Circuits

If the integrated circuit is fabricated for a process involving analog and digital circuits, use of antiparallel diodes, as depicted in FIG. 9, provide isolation from the effects of digital switching transients on the analog and digital voltage sources.

Alternative Embodiment: Noise Isolation

If the integrated circuit is fabricated for a process involving circuits with mixed voltages, use of additional diodes, as depicted in FIG. 9, provide added noise margin between external and internal circuitry.

Alternative Embodiment: External Low Voltage Supply

If the integrated circuit is fabricated for a process requiring a single external low voltage supply, we protect against transient hits on the low voltage as well as the high voltage.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The various inventions described above can also be applied to any other on-chip supply voltages, or combinations of two or more supply voltages, or combinations of three or more supply voltages, or combinations of power supply domains.

What is claimed is:

1. An integrated circuit structure, comprising:
   a semiconductor substrate having:
      a plurality of contact pads including a first contact pad for connection to a first external power supply voltage;
      an overvoltage protection circuit for said integrated circuit structure operatively connected to said first contact pad; and
      a power supply line connected to said overvoltage protection circuit and to said first contact pad to supply power to internal circuitry of said integrated circuit; said power supply line disposed over a predetermined portion of said substrate to provide a distributed capacitor in conjunction with said predetermined portion of said substrate to increase the capacitance between said power supply line and said substrate, said distributed capacitor delaying the rise in transient voltage levels and also reducing voltage supply noise when a voltage transient appears at said first contact pad.

2. The integrated circuit structure in claim 1, wherein said distributed capacitor more than triples the native capacitance per unit length of said power supply line.

3. The integrated circuit structure in claim 1, wherein said distributed capacitance is more than thirty times the native capacitance per unit length of said power supply line.

4. The integrated circuit structure in claim 1, wherein said distributed capacitor is a junction capacitor.

5. The integrated circuit structure in claim 1, wherein said distributed capacitor is MOS capacitor.

6. The integrated circuit structure in claim 1, wherein said distributed capacitor is a narrow N-well junction capacitor.

7. The integrated circuit structure in claim 1, wherein said overvoltage protection circuit comprises an NMOS device operatively connected between said first contact pad and a common reference point, and a first diode operatively connected in a forward bias mode between said first contact pad and said first power supply voltage, and a pair of antiparallel diodes operatively connected between said first power supply voltage and a second power supply voltage.

8. The integrated circuit structure in claim 1, wherein at least one output circuit is operatively connected to said first power supply voltage and at least one internal circuit is operatively connected to a second power supply voltage, said second power supply voltage is less than said first power supply voltage.

9. An integrated circuit structure, comprising:
   a semiconductor substrate having inner circuitry:
      a first contact pad of a plurality of contact pads for connection to a first power supply voltage;
      an overvoltage protection circuit for said integrated circuit structure comprising a series impedance operatively connected to a voltage-dependent shunt resistance, said overvoltage protection circuit being operatively connected to said first contact pad;
      a second power supply voltage operatively connected to said inner circuitry within said integrated circuit; said second supply voltage being lower than said first supply voltage; and
      a power supply line including antiparallel pair of rectifying elements interposed between said first power supply voltage and said second power supply voltage, said power supply line operatively connected to said overvoltage protection circuit and to said first contact pad to supply power to internal circuitry of said integrated circuit; said power supply line connected in parallel with a predetermined portion of said substrate to provide a distributed capacitor which increases the capacitance between said power supply line and said substrate, said distributed capacitor delaying the rise in transient voltage levels and also reducing voltage supply noise when a voltage transient appears at said first contact pad; said antiparallel pair of rectifying elements delaying the rise in transient voltage levels from said first power supply voltage to said second power supply voltage.

10. The integrated circuit structure of claim 9, wherein said power supply line includes a distributed capacitor that more than triples the native capacitance per unit length of said power supply line.

11. The integrated circuit structure of claim 9, wherein a second power supply voltage line includes a distributed capacitor that more than triples the native capacitance per unit length of said second power supply line.

12. The integrated circuit structure in claim 9, wherein said power supply line includes a distributed capacitor that is more than thirty times the native capacitance per unit length of said power supply line.

13. The integrated circuit structure in claim 9, wherein a second power supply voltage line includes a distributed capacitance that is more than thirty times the native capacitance per unit length of said second power supply line.

14. The integrated circuit structure of claim 9, wherein said power supply line includes a distributed capacitor that is a junction capacitor.

15. The integrated circuit structure of claim 9, wherein a second power supply voltage line includes a distributed capacitor that is MOS capacitor.

16. The integrated circuit structure of claim 9, wherein said overvoltage protection circuit comprises an NMOS device operatively connected between said first contact pad and a common reference point, and a first diode operatively connected in a forward bias mode between said first contact pad and said first power supply voltage.

17. An integrated circuit structure, comprising
   a semiconductor substrate having internal core circuitry;

a plurality of contact pads including a first contact pad for connection to a power supply voltage on said substrate;

an overvoltage protection circuit operatively connected to said first contact pad, and comprising a series impedance operatively connected to a voltage-dependent shunt resistance;

at least a pair of back-to-back rectifying elements interposed between said power supply voltage and said internal core circuitry; and a power supply line including said rectifying elements interposed between said power supply and said internal core circuitry, said power supply line operatively connected to said overvoltage protection circuit and to said first contact pad to supply power to said internal core circuitry of said integrated circuit structure; said power supply line connected in parallel with a predetermined portion of said substrate to provide a distributed capacitor which increases the capacitance between said power supply line and said substrate, said distributed capacitor delaying the rise in transient voltage levels and also reducing voltage supply noise when a voltage transient appears at said first contact pad.

18. The integrated circuit structure of claim 17, wherein each said rectifying element is a diode.

19. The integrated circuit structure of claim 17, wherein each said rectifying element is a Schottky diode.

20. The integrated circuit structure of claim 17, wherein each said rectifying element is a MOS diode.

21. The integrated circuit structure of claim 17, wherein said integrated circuit structure comprises both analog and digital circuitry isolated from one another by said at least a pair of back-to-back rectifying elements.

22. The integrated circuit structure of claim 17, wherein said integrated circuit structure requires two external supply voltages.

23. The integrated circuit structure of claim 17, wherein said power supply voltage is 5 volts and voltage supplied to said inner core circuitry is less than said power supply voltage and varies down to 2.5 volts by selecting an appropriate number of said at least a pair of rectifying elements.

24. A method fabricating an integrated circuit having circuitry for protecting against ESD, comprising the steps of:

(a) providing an integrated circuit including a semiconductor substrate having a first contact pad, an overvoltage protection circuit operatively connected to said first contact pad and a source of dirty voltage coupled to said contact pad; and (b) providing a source of clean voltage to said integrated circuit by:
  (i) providing a second contact pad; and
  (ii) coupling said dirty voltage at said first contact pad to said second contact pad via lines which maximize the capacitance between said lines and said semiconductor substrate.

25. The method of claim 24 wherein the maximization of said capacitance is provided by running said lines along and in parallel with an n+ region in said substrate.

26. The method of claim 25 further including the step of providing antiparallel diodes between said first and second contact pads.

27. The method of claim 24 wherein the maximization of said capacitance is provided by running said lines in parallel with reference voltage lines.

28. The method of claim 27 further including the step of providing antiparallel diodes between said first and second contact pads.

29. The method of claim 24 further including the step of providing antiparallel diodes between said first and second contact pads.

* * * * *